(12) United States Patent
Xu et al.

(10) Patent No.: US 8,663,735 B2
(45) Date of Patent: Mar. 4, 2014

(54) IN SITU GENERATION OF RUO4 FOR ALD OF RU AND RU RELATED MATERIALS

(75) Inventors: Chongying Xu, New Milford, CT (US); Weimin Li, New Milford, CT (US); Thomas M. Cameron, Newtown, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 936 days.

(21) Appl. No.: 12/705,587

(22) Filed: Feb. 13, 2010

(65) Prior Publication Data

US 2010/0209598 A1    Aug. 19, 2010

Related U.S. Application Data

(60) Provisional application No. 61/152,604, filed on Feb. 13, 2009.

(51) Int. Cl.
*C23C 16/40*    (2006.01)

(52) U.S. Cl.
USPC .................... 427/255.31; 427/255.32; 117/86

(58) Field of Classification Search
USPC ...................... 427/255.31, 255.32; 117/84, 86
See application file for complete search history.

(56) References Cited

U.S. PATENT DOCUMENTS

| | | | |
|---|---|---|---|
| 4,927,670 A | 5/1990 | Erbil | |
| 4,948,623 A | 8/1990 | Beach et al. | |
| 5,453,494 A | 9/1995 | Kirlin et al. | |
| 5,820,664 A | 10/1998 | Gardiner et al. | |
| 5,840,897 A | 11/1998 | Kirlin et al. | |
| 5,916,359 A | 6/1999 | Baum et al. | |
| 5,919,522 A | 7/1999 | Baum et al. | |
| 6,002,036 A | 12/1999 | Kadokura | |
| 6,036,741 A * | 3/2000 | Shindo et al. | ................ 75/10.28 |
| 6,110,529 A | 8/2000 | Gardiner et al. | |
| 6,111,122 A | 8/2000 | Paw et al. | |
| 6,117,571 A | 9/2000 | Baum et al. | |
| 6,126,996 A | 10/2000 | Kirlin et al. | |
| 6,214,105 B1 | 4/2001 | Hintermaier et al. | |
| 6,218,518 B1 | 4/2001 | Baum et al. | |

(Continued)

FOREIGN PATENT DOCUMENTS

JP    3-100500    *    4/1991
SU    768457 A         10/1980

(Continued)

OTHER PUBLICATIONS

Sasahira, Akira, et al., "Formation Rate and Gas-Liquid Equilibrium of RuO4". Journal of Nuclear Science and Technology, 25(5), pp. 472-478 (May 1988).*

(Continued)

*Primary Examiner* — Bret Chen
(74) *Attorney, Agent, or Firm* — Hultquist PLLC; Steven J. Hultquist; Mary B. Grant

(57) ABSTRACT

Apparatus and method for generating ruthenium tetraoxide in situ for use in vapor deposition, e.g., atomic layer deposition (ALD), of ruthenium-containing films on microelectronic device substrates. The ruthenium tetraoxide can be generated on demand by reaction of ruthenium or ruthenium dioxide with an oxic gas such as oxygen or ozone. In one implementation, ruthenium tetraoxide thus generated is utilized with a strontium organometallic precursor for atomic layer deposition of strontium ruthenate films of extremely high smoothness and purity.

9 Claims, 3 Drawing Sheets

(56) References Cited

U.S. PATENT DOCUMENTS

| | | | |
|---|---|---|---|
| 6,277,436 | B1 | 8/2001 | Stauf et al. |
| 6,284,654 | B1 | 9/2001 | Roeder et al. |
| 6,303,391 | B1 | 10/2001 | Hintermaier et al. |
| 6,344,079 | B1 | 2/2002 | Baum |
| 6,440,495 | B1 | 8/2002 | Wade et al. |
| 6,444,264 | B2 | 9/2002 | Hintermaier et al. |
| 6,458,183 | B1 * | 10/2002 | Phillips et al. ............... 75/631 |
| 6,479,100 | B2 | 11/2002 | Jin et al. |
| 6,506,666 | B2 | 1/2003 | Marsh |
| 6,537,370 | B1 | 3/2003 | Hernandez et al. |
| 6,680,251 | B2 | 1/2004 | Won et al. |
| 6,743,739 | B2 | 6/2004 | Shimamoto et al. |
| 6,849,122 | B1 | 2/2005 | Fair |
| 6,884,901 | B2 | 4/2005 | Thompson et al. |
| 6,921,062 | B2 | 7/2005 | Gregg et al. |
| 6,984,591 | B1 | 1/2006 | Buchanan et al. |
| 7,211,509 | B1 | 5/2007 | Gopinath et al. |
| 7,285,308 | B2 | 10/2007 | Hendrix et al. |
| 7,300,038 | B2 | 11/2007 | Gregg et al. |
| 7,323,581 | B1 | 1/2008 | Gardiner et al. |
| 7,531,679 | B2 | 5/2009 | Wang et al. |
| 7,544,389 | B2 * | 6/2009 | Dussarrat et al. .......... 427/248.1 |
| 8,092,721 | B2 * | 1/2012 | Gatineau et al. ............ 252/521.1 |
| 8,329,569 | B2 * | 12/2012 | Li ................................. 438/584 |
| 8,435,428 | B2 * | 5/2013 | Xia et al. ..................... 252/519.3 |
| 2003/0032238 | A1 * | 2/2003 | Kim et al. ...................... 438/253 |
| 2003/0165615 | A1 | 9/2003 | Aaltonen et al. |
| 2004/0166671 | A1 | 8/2004 | Lee et al. |
| 2004/0202593 | A1 * | 10/2004 | Phillips et al. ................. 422/187 |
| 2004/0215030 | A1 | 10/2004 | Norman |
| 2006/0128150 | A1 | 6/2006 | Gandikota et al. |
| 2006/0292841 | A1 * | 12/2006 | Quick ............................ 438/584 |
| 2007/0031597 | A1 * | 2/2007 | Cho et al. .................... 427/248.1 |
| 2007/0054487 | A1 | 3/2007 | Ma et al. |
| 2007/0218205 | A1 | 9/2007 | Hendrix et al. |
| 2007/0235059 | A1 * | 10/2007 | Chu et al. ......................... 134/1.1 |
| 2008/0254218 | A1 | 10/2008 | Lei et al. |
| 2009/0084288 | A1 | 4/2009 | Wang et al. |
| 2009/0242852 | A1 * | 10/2009 | Gatineau et al. ............ 252/518.1 |
| 2010/0095865 | A1 | 4/2010 | Xu et al. |
| 2010/0116738 | A1 * | 5/2010 | Xia et al. ........................ 210/638 |
| 2012/0058043 | A1 * | 3/2012 | Meyer et al. ................. 423/592.1 |
| 2012/0216712 | A1 * | 8/2012 | Paranjpe et al. ......... 106/287.18 |
| 2013/0059078 | A1 * | 3/2013 | Gatineau et al. ............... 427/252 |

FOREIGN PATENT DOCUMENTS

| | | |
|---|---|---|
| WO | 0015865 A1 | 3/2000 |
| WO | 2008057616 A2 | 5/2008 |
| WO | 2009020888 A1 | 2/2009 |

OTHER PUBLICATIONS

Gatineau, Julien, et al., "A new $RuO_4$ solvent solution for pure ruthenium film depositions". Microelectronic Engineering 83 (2006 2248-2252.*

Holm, Joachim, et al., "Deposition of $RuO_4$ on various surfaces in a nuclear reactor containment". Journal of Nuclear Materials, 392 (2009) 55-62.*

Mun, C., et al., "Study of $RuO_4$ decomposition in dry and moist air". Radiochim. Acta 95, 643-656 (2007).*

Yuan, Zheng, et al., "Low-Temperature Chemical Vapor Deposition of Ruthenium Dioxide from Ruthenium Tetroxide: A Simple Approach to High-Purity $RuO_2$ Films". Chem. Mater., 1993, 5, 908-910.*

Sankar, Jayasree, et al., "Low temperature chemical vapour deposition of ruthenium and ruthenium dioxide on polymer surfaces". Journal of Materials Chemistry, 1999, 9, 2439-2444.*

Papadatos, Filippos, et al., "Characterization of Ruthenium and Ruthenium Oxide Thin Films deposited by Chemical Vapor Deposition for CMOS Gate . . . ", "Mat. Res. Soc. Symp. Proc.", 2003, pp. N3.3.1-N3.3.6, vol. 745.

Anderson, Q. et al. , "Synthesis and Characterization of the First Pentaphenyicyclopentadieny Copper Complex ($Ph_5CP)Cu(PPh_3)$", "Organometallics", 1998, pp. 4717-4920, vol. 17.

Artaud-Gillet, M.C. et al. , "Evaluation of copper organometallic sources for $CuGaSe_2$ photovoltaic applications", "Journal of Crystal Growth", 2003, pp. 163-168, vol. 246.

Macomber, D. et al. , "n5-Cyclopentadienyl- and n5-Pentamethylcyclopentadienyl copper compounds Containing Phosphine, Carbonyl, and n2 -Acetyle", "J. Am. Chem.", 1983, pp. 5325-5329, vol. 105.

Ren, H. et al. , "Sythesis and structures of cylopentadienyl N-heterocyclic carbene copper complexes", "Journal of Organometallic Chemistry", 2006, pp. 4109-4113, vol. 691.

Christen, H., et al., "Semiconducting epitaxial films of metastable $SrRu_{0.5}Sn_{0.5}O_3$ grown by pulsed laser deposition", "Applied Physics Letters", 1997, pp. 2147-2149 (Title and Abstract), vol. 70, No. 16.

Kvyatkovskii, O., "On the Nature of Ferroelectricity in $Sr_{1-x}A_xTiO_3$ and $KTa_{1-x}Nb_xO_3$ Solid Solutions", "Physics of Solid State", 2002, pp. 1135-1144, vol. 44, No. 6.

Lu, H., et al., "Evolution of itinerant ferromagnetism in $Sr_xPb_{1-x}RuO_3$ ($0 \leq x \leq 1$): Interplay between Jahn—Teller distortion and A-site disorder", "Applied Physics Letters", Mar. 22, 2011, pp. 1-3, vol. 98, No. 122503.

Niinistoe, J., et al., "Atomic Layer Deposition of High-k Oxides of the Group 4 Metals for Memory Application", "Advanced Engineering Materials", Mar. 9, 2009, pp. 223-224, vol. 11, No. 4.

Wu, L., et al., "Humidity Sensitivity of $Sr(Sn, Ti)O_3$ Ceramics", "Journal of Electronic Materials", 1990, pp. 197-200, vol. 19, No. 2.

* cited by examiner

IN SITU GENERATION OF RUO4 FOR ALD OF RU AND RU RELATED MATERIALS

CROSS-REFERENCE TO RELATED APPLICATION

This application claims the benefit of priority under the provisions of 35 USC §119 of U.S. Provisional Patent Application No. 61/152,604 filed Feb. 13, 2009. The disclosure of such U.S. Provisional Patent Application No. 61/152,604 is hereby incorporated herein by reference in its respective entirety, for all purposes.

FIELD

The present invention relates to apparatus and method for in situ generation of ruthenium tetraoxide ($RuO_4$) for use in vapor deposition, e.g., atomic layer deposition (ALD), of ruthenium-containing films in the manufacture of microelectronic devices such as high k dielectric material capacitors having ruthenium-containing electrode(s).

RELATED ART

Ruthenium (Ru) and Group II metal ruthenates such as strontium ruthenate ($SrRuO_3$) are promising electrode materials for high k capacitor applications. Smooth thin layers of Ru metal films can also be employed as seed layers or barrier layers for Cu electroplating in copper metallization processes.

ALD is often used as a technique to deposit Ru and Ru-containing thin films to achieve superior step coverage in high aspect ratio structures. For such purpose, metal organic precursors, e.g., ruthenium cyclopentadienyls or ruthenium β-diketonates such as $(Et(Cp)_2Ru$ and $Ru(thd)_3$, wherein Cp is cyclopentadienyl, Et is ethyl, and thd is 2,2,6,6-tetramethyl-3,5-heptanedionate, are commonly used. These precursors, however, require long incubation times and frequently produce deposited films that are very rough in texture.

The art therefore continues to seek improved ruthenium precursors for vapor deposition processes to form ruthenium-containing thin films without the long incubation times and rough films characteristic of the use of metal organic ruthenium precursors of the prior art.

SUMMARY

The present invention relates to apparatus and method for generating ruthenium tetraoxide on demand for use in manufacturing semiconductor or other microelectronic devices.

In one aspect, the invention relates to a system for manufacturing a microelectronic device, comprising:
(A) a ruthenium tetraoxide ($RuO_4$) source, adapted for in situ generation of $RuO_4$, said source including:
  (i) an oxic gas supply; and
  (ii) a container holding at least one $RuO_4$ precursor selected from among Ru and $RuO_2$, said container being adapted for heating to temperature in a range of from 40° C. to 400° C., having an inlet for introducing an oxic gas into said container for reaction with said $RuO_4$ precursor to form gaseous $RuO_4$ and having an outlet for flowing gaseous $RuO_4$ out of the container; and
(B) a semiconductor manufacturing vapor deposition tool arranged to receive gaseous $RuO_4$ discharged from such container through said outlet, and to effect contacting of said gaseous $RuO_4$ with a microelectronic device substrate to deposit Ru and/or $RuO_2$ thereon.

Another aspect of the invention relates to a method of manufacturing a microelectronic device, comprising:
providing at least one $RuO_4$ precursor selected from among Ru and $RuO_2$;
contacting the $RuO_4$ precursor with an oxic gas at temperature in a range of from 40° C. to 400° C. to form gaseous $RuO_4$; and
contacting the gaseous $RuO_4$ with a microelectronic device substrate under vapor deposition conditions to deposit Ru and/or $RuO_2$ thereon.

A further aspect of the invention relates to a ruthenium tetraoxide supply apparatus, comprising a container holding at least one $RuO_4$ precursor selected from among Ru and $RuO_2$, said container being adapted for heating to temperature in a range of from 40° C. to 400° C., having an inlet for introducing an oxic gas into said container for reaction with said $RuO_4$ precursor to form gaseous $RuO_4$ and having an outlet for flowing gaseous $RuO_4$ out of the container.

Other aspects, features and embodiments of the invention will be more fully apparent from the ensuing disclosure and appended claims.

DETAILED DESCRIPTION

Figure 1:
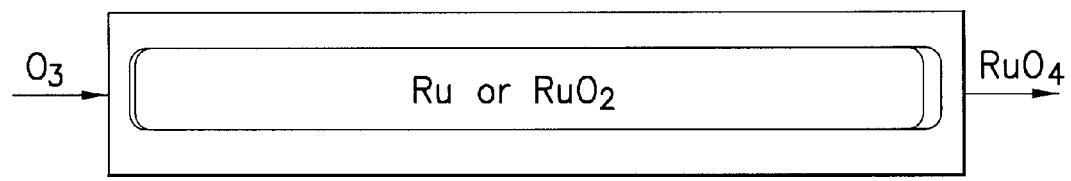
FIG. 1 is a schematic representation of an in situ ruthenium tetraoxide ($RuO_4$) generator of a type usefully employed in the ALD systems and processes of the invention.

The present invention relates to use of ruthenium tetraoxide as a precursor for vapor deposition of ruthenium-containing films, e.g., in the manufacture of high k capacitor devices, wherein the ruthenium tetraoxide precursor is generated in situ and flowed from the location of generation to a vapor deposition apparatus in which the ruthenium tetraoxide precursor vapor is contacted under vapor deposition conditions with a microelectronic device substrate, such as a silicon wafer, or other semiconductor substrate.

In a specific embodiment, the invention relates to an atomic layer deposition method for forming a strontium ruthenate film on a substrate, e.g., in the manufacture of a high k dielectric material capacitor on a microelectronic device substrate.

The invention also contemplates apparatus and method for abatement of a ruthenate-containing effluent from a ruthenium-containing film formation process, in which the effluent from the deposition of the ruthenium-containing film is contacted with an abatement composition comprising an acid, or a base, or other recovery medium, for recovery of ruthenium.

The invention provides an efficient and economic apparatus and method for forming Ru and $SrRuO_3$ electrodes, e.g., in the fabrication of DRAM capacitors.

The invention achieves a major advance over the use of metal organic precursors for vapor deposition of ruthenium.

Such metal organic precursors have the disadvantages of long incubation times, produce rough films that also incorporate significant levels of carbon and oxygen, and realize only low utilization levels of precursor, e.g., 10 grams precursor per wafer. The present invention by using $RuO_4$ as a precursor for vapor deposition of ruthenium-containing films on microelectronic device substrates, provides a highly volatile precursor that produces extremely smooth films with no carbon incorporation in the film. The invention also resolves safety and performance issues related to the toxicity of $RuO_4$ and the inability to store it in a pressurized vessel because of its instability under long-term storage conditions and susceptibility to explosive hazard.

The invention utilizes the approach of generating $RuO_4$ on demand, at the point of use from Ru and/or $RuO_2$ both of which are very stable and non-toxic solids. The $RuO_4$ is generated by reaction with an oxic gas, such as ozone, oxygen, nitrogen oxide, singlet oxygen, air, or other oxic (oxygen-containing) gas. Once generated, the $RuO_4$ is contacted with the microelectronic device substrate, resulting in efficient formation of ruthenium-containing films, such as films of elemental Ru or $RuO_2$, and any effluent containing $RuO_4$, $RuO_2$, and unreacted oxic gas is readily abated by scrubbing the effluent gas with dilute acid or other suitable scrubbing medium. The effluent waste resulting from the abatement can be collected for refining of Ru metal to further enhance the economics of the process.

$RuO_4$ thus can be generated only when needed, as a reaction product produced by reaction of the ruthenium starting material, comprising Ru and/or $RuO_2$, with the oxic gas. For such purpose, the ruthenium starting material can be provided in a storage and dispensing vessel through which the oxic gas is flowed for contact with the ruthenium starting material, to produce $RuO_4$ as a reaction product gas that can be discharged from the storage and dispensing vessel at a desired rate, by use of a flow control valve, mass flow controller, restricted flow orifice, or other flow control element(s) and/or flow circuitry The $RuO_4$ subsequent to generation at the point of use, is contacted with a microelectronic device substrate, e.g., a silicon wafer or other microelectronic device precursor structure under vapor deposition conditions, so that a ruthenium material comprising elemental ruthenium and/or ruthenium dioxide is deposited on the surface of the substrate.

In one preferred aspect of the invention, atomic layer deposition (ALD) is carried out using $RuO_4$ and a strontium organo-metallic precursor, such as $Sr(^nPrMe_4Cp)_2$, $Sr(EtMe_4Cp)_2$, $Sr(thd)_2$, or $Sr(thd)_2 \cdot PMDETA$, involving pulsing of the Sr precursor into the ALD deposition chamber for strontium oxide deposition on the substrate surface, following which excess Sr precursor is purged from the deposition chamber, and $RuO_4$ and $O_3$ (or other oxic gas) are pulsed into the deposition chamber. The $RuO_4$ and $O_3$ thereby serve as oxidant and ruthenium deposition source materials. After contact with the substrate surface by the $RuO_4$ and $O_3$, the deposition chamber is purged of the $RuO_4$, and the aforementioned steps of ruthenium precursor contacting and strontium precursor contacting then are carried out alternatingly and repetitively in sequence, to form a $SrRuO_3$ film on the substrate.

$RuO_4$ is a very volatile and small molecule, which easily penetrates into deep trenches in the microelectronic device substrate. The presence of ozone ($O_3$) as the oxic gas is highly beneficial in stabilizing the $RuO_4$ to avoid its premature decomposition, with oxygen and ozone both reacting with $RuO_2$ to form $RuO_4$ by the following reactions:

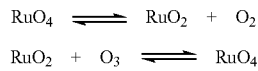

$RuO_4$ can be used as a chemical vapor deposition precursor to deposit Ru or $RuO_2$ films. In addition, $RuO_4$ can be used as an oxidant to react with ruthenium metal organic precursors, e.g., ruthenium cyclopentadienyls such as $(Et(Cp)_2Ru$ and/or or ruthenium β-diketonates such as $Ru(thd)_3$, wherein Cp is cyclopentadienyl, Et is ethyl, and thd is 2,2,6,6-tetramethyl-3,5-heptanedionate, to form ruthenium thin films. As used herein, a thin film is a film having a thickness not exceeding 1 micrometer, such as in a range of from 2 to 1000 nanometers.

Concerning abatement of effluent from the ruthenium film deposition processes of the invention, $RuO_4$ decomposes rapidly when it is mixed with dilute acid, such as HCl, or a base. The effluent waste resulting from the ruthenium film formation processes of the invention therefore can be readily treated by contacting with dilute acid, to recover and recycle Ru metal, e.g., for using in fabricating electrodes in DRAM applications.

DRAM devices can be formed with electrodes of ruthenium or ruthenium oxide by vapor deposition processes of the present invention, to form capacitor structures based on high k dielectric materials such as strontium titanate (STO) and barium strontium titanate (BST).

$RuO_4$ is a yellow highly viscous liquid at room temperature (26-30° C.), having a boiling point of 130° C., a melting point of 25.4° C. and a vapor pressure of 10 torr at 25° C. It is a strong oxidant to organics.

FIG. 1 is a schematic representation of an in situ ruthenium tetraoxide ($RuO_4$) generator of a type usefully employed in the ALD systems and processes of the invention. As illustrated, a vessel is provided that holds Ru and/or $RuO_2$ source material, and ozone or other oxic gas is flowed through the vessel, to generate $RuO_4$.

$RuO_4$ thus can be generated for use in CVD and/or ALD applications using a vessel holding the Ru and/or $RuO_2$ source material. The source material may be in any suitable form, such as a powder, porous block, deposited layer of source material, or other appropriate form. In one embodiment, the ruthenium source material is provided in a porous, foamed, or powder form in a vessel such as a Pro-Evap™ solid source vaporizer, commercially available from ATMI, Inc. (Danbury, Conn., USA). Oxygen or ozone with inert gas(es) is passed through the vessel at elevated temperature, e.g., a temperature in a range of from 40° C. to 400° C., to form $RuO_4$. The ruthenium tetraoxide resulting from the reaction of Ru or $RuO_2$ and the ozone/oxygen gas is flowed from the vessel to a deposition chamber, such as an ALD chamber, for deposition of Ru thin film, or Ru-containing materials such as strontium ruthenate (SRO), when a strontium source is also employed in the deposition process.

Figure 2:
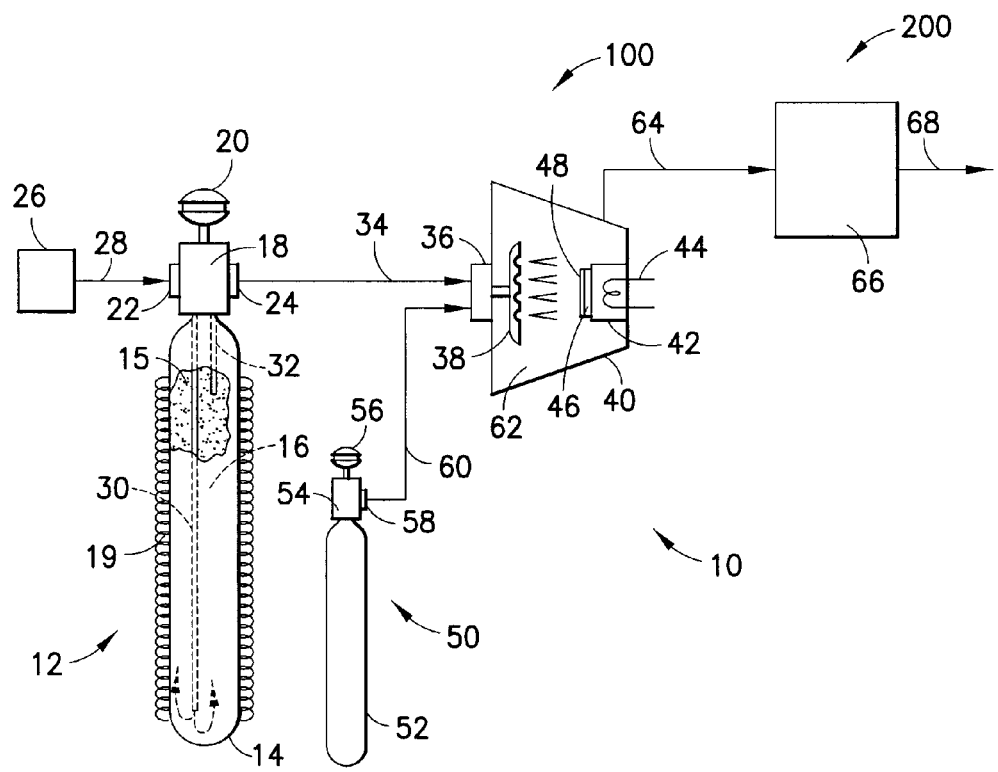
FIG. 2 is a schematic representation of an ALD process system incorporating a ruthenium tetraoxide in situ generation system according to one embodiment of the invention.

FIG. 2 is a schematic representation of an ALD process system 10 incorporating a ruthenium tetraoxide in situ generation system according to one embodiment of the invention.

As illustrated, the system 10 includes an in situ generator 12 for producing ruthenium tetraoxide, a strontium precursor source 50, an atomic layer deposition apparatus 100, and an effluent abatement apparatus 200 for abating the ruthenium-containing output resulting from the ALD process to produce a ruthenium-reduced effluent.

The in situ generator 12 includes a storage and dispensing vessel 14 such as a conventional gas cylinder container holding a ruthenium tetraoxide precursor 15, such as elemental ruthenium or ruthenium dioxide. In the embodiment shown, the precursor 15 is constituted by a ruthenium metal foam in the interior volume 16 of the vessel.

The vessel includes a valve head 18 containing a valve (not shown) that is actuated by the hand wheel 20, or by an automatic valve actuator, to open or close the container to flow. Joined to the valve head 18 is a feed conduit 30 that communicates with the valve head inlet 22 through an inlet passage in the valve head, and terminates at a lower end in the lower portion of the vessel 14. The valve head also includes an outlet 24 that communicates with a discharge conduit 32 terminating at a lower end in an upper portion of the interior volume 16 of the vessel 14.

By such arrangement, oxic gas is enabled to flow from inlet 22 through the valve head 18 into the feed conduit 30 for discharge in the lower portion of the vessel and flow upwardly through the ruthenium tetraoxide precursor for reaction to form the ruthenium tetraoxide. The resulting ruthenium oxide then flows through the discharge conduit 32 through the valve head to outlet 24, for dispensing from the vessel.

As illustrated, the vessel 14 is circumscribed along its length by a heating coil 19 that may be energized by a suitable power supply (not shown). Alternately, the vessel may be equipped with a heating jacket, disposed in a heating bath, have heating coils embedded in the vessel wall, or otherwise be adapted for heating of the vessel to temperature in a range of from 40° C. to 400° C.

The system 10 includes an oxic gas source 26, which may for example comprise an oxygen cylinder, compressed air supply, ozone generator, or other suitable source of oxic gas for the system. The oxic gas source 26 is coupled by feed line 28 with the inlet 22 of the container holding the ruthenium tetraoxide precursor.

The system 10 also includes a vapor delivery line 34 connected with inlet 36 of vapor deposition apparatus comprising an atomic layer deposition apparatus 100. The ALD apparatus 100 includes an ALD deposition chamber 40 enclosing an interior volume 62 in which it is mounted in a showerhead disperser 38 communicating with inlet 36 for discharge of vapor. From the showerhead, the vapor is impinged on a microelectronic device substrate 46 to form a ruthenium-containing film 48 thereon. The microelectronic device substrate 46 is mounted on susceptor 42, which is heated by an embedded coil 44 to appropriate temperature for the atomic layer deposition operation.

Further included in the system 10 is a strontium precursor source 50, comprising a precursor storage and dispensing vessel 52 with valve head 54 to which is coupled with hand wheel 56 to control the valve in the valve head. The valve head has an outlet 58 coupled to feed line 64 delivery of strontium precursor from vessel 52 to the inlet 36 of the ALD apparatus 100.

An effluent discharge line 64 is coupled to ALD chamber 40, for discharge of effluent from the ALD process to the effluent abatement apparatus 200. Such apparatus may comprise a scrubbing apparatus 66 in which the ruthenium-containing effluent resulting from the ALD operation in chamber 40 is scrubbed with an acidic medium for treatment of the effluent to produce a ruthenium-reduced effluent that is discharged from the scrubbing apparatus 66 in discharge line 68, for venting to the atmosphere, or other treatment or disposition.

By such treatment, the ruthenium oxides in the ruthenium-containing effluent are scrubbed to recover ruthenium. Such recovered ruthenium that can be processed for reuse in the system, thereby lowering the capital and operating costs of the system.

In operation at the system 10 illustrated in FIG. 2, ruthenium precursor and strontium precursor from the respective sources are sequentially and alternatingly contacted with the microelectronic device substrate to form a strontium ruthenate ($SrRuO_3$) film on the substrate.

The ALD process can be carried out in any suitable manner that is effective to deposit the ruthenium and strontium material on the substrate.

For example, a cylinder-type container may be packed with porous Ru metal or $RuO_2$, with oxygen or ozone being passed through the container at elevated temperature to generate $RuO_4$ for the ALD formation of an SRO electrode, as described above. An organo strontium precursor can be used that is compatible with the process conditions, e.g., $Sr(Cp)_2$, wherein Cp=cyclopentadienyl, or a $Sr(beta-diketonate)_2$ precursor such as $Sr(thd)_2$. The respective $RuO_4$ and organometallic Sr precursors are then alternatively and repetitively contacted with the microelectronic device substrate for as many repetitive cycles as necessary to form a $SrRuO_3$ film of predetermined thickness.

The process conditions for deposition of Ru-containing films in accordance with the invention may be carried out at any suitable temperature, pressure, flow rate and other process conditions, as necessary or desirable to form an Ru-containing film of appropriate character for a specific application, as is readily determinable within the skill of the art based on the disclosure herein.

It will be appreciated that the apparatus of the invention may be configured in a wide variety of arrangements, for the vapor phase deposition of ruthenium within the broad scope of the invention. In one embodiment, the apparatus is configured as a system for manufacturing a microelectronic device, comprising:

(A) a ruthenium tetraoxide ($RuO_4$) source, adapted for in situ generation of $RuO_4$, in which the source includes:
  (i) an oxic gas supply; and
  (ii) a container holding at least one $RuO_4$ precursor selected from among Ru and $RuO_2$, such container being adapted for heating to temperature in a range of from 40° C. to 400° C., having an inlet for introducing an oxic gas into the container for reaction with the $RuO_4$ precursor to form gaseous $RuO_4$ and having an outlet for flowing gaseous $RuO_4$ out of the container; and (B) a semiconductor manufacturing vapor deposition tool arranged to receive gaseous $RuO_4$ discharged from such container through the outlet, and to effect contacting of the gaseous $RuO_4$ with a microelectronic device substrate to deposit Ru and/or $RuO_2$ thereon.

Such system may further include a heater arranged to heat the container to the desired temperature. The oxic gas supply can supply an oxic gas such as oxygen, ozone, air, or nitrogen oxide. In one specific embodiment, the oxic gas is ozone, and the oxic gas supply comprises an ozone generator.

The semiconductor manufacturing vapor deposition tool that is employed can be of any suitable type, and can include a chemical vapor deposition apparatus, or alternatively an atomic layer deposition apparatus. The atomic layer deposition apparatus may as indicated be arranged to flow a strontium precursor from a strontium precursor source to the apparatus, for depositing a strontium ruthenium oxide film on a microelectronic device substrate.

Such strontium ruthenium oxide film may define a $SrRuO_3$ electrode structure on the microelectronic device substrate.

The container employed to supply the ruthenium tetraoxide can be of any suitable type, and may for example include support surface elements in the interior volume of such container, in contact with the ruthenium tetraoxide precursor. The support surface elements may include plates, shelves, trays or other internal support surface elements, in contact with the $RuO_4$ precursor. For example, the support surface elements may comprise an array of trays on which the precursor is reposed on the tray surfaces.

Alternatively, the ruthenium tetroxide precursor may be present in the container in the form of a porous foam material.

The vapor deposition chamber can be coupled in a relationship with an abatement tool, such as a scrubber, catalytic oxidizer, chemisorbent unit, physical adsorbent system or other abatement apparatus unsuitable character to treat the effluent for reduction and/or recovery of ruthenium therein, to produce a ruthenium-reduced effluent. For example, a scrubber apparatus may be arranged to contact the effluent from the vapor deposition tool with an acidic scrubbing medium such as the HCl or other scrubbing agent effective to reduce ruthenium in said effluent.

The invention us provides a method of manufacturing a microelectronic device, comprising:

providing at least one $RuO_4$ precursor selected from among Ru and $RuO_2$;

contacting the $RuO_4$ precursor with an oxic gas, e.g., oxygen, ozone, air, nitrogen oxide, etc., at temperature in a range of from 40° C. to 400° C. to form gaseous $RuO_4$; and contacting the gaseous $RuO_4$ with a microelectronic device substrate under vapor deposition conditions to deposit Ru and/or $RuO_2$ thereon.

The contacting may comprise chemical vapor deposition, atomic layer deposition, or other vapor deposition operation. The contacting in a specific embodiment may comprise contacting the microelectronic device substrate with a strontium-containing precursor vapor, e.g., $SrO_2$, alternatingly and repetitively with such contacting of the microelectronic device substrate with the gaseous $RuO_4$, so as to form a strontium- and ruthenium-containing film on the microelectronic device substrate.

In such manner, a $SrRuO_3$ film can be formed that is extremely smooth in character, and free of the presence of carbon. Such film is suitable for forming an electrode of a capacitor on the microelectronic device substrate. Such capacitor may comprise a high k dielectric material, such as barium titanate or barium strontium titanate, in a DRAM device.

The invention also contemplates a ruthenium tetraoxide supply apparatus, comprising a container holding at least one $RuO_4$ precursor selected from among Ru and $RuO_2$, such container being adapted for heating to temperature in a range of from 40° C. to 400° C., having an inlet for introducing an oxic gas into said container for reaction with the $RuO_4$ precursor to form gaseous $RuO_4$ and having an outlet for flowing gaseous $RuO_4$ out of the container. The apparatus may further comprise a heater adapted to heat the container to the aforementioned temperature in the range from 40° C. to 400° C.

Such ruthenium tetraoxide supply apparatus may further include an oxic gas source coupled with the container and arranged for flow of oxic gas from an oxic gas source through the container, for contacting with the ruthenium tetraoxide precursor therein.

Figure 3:
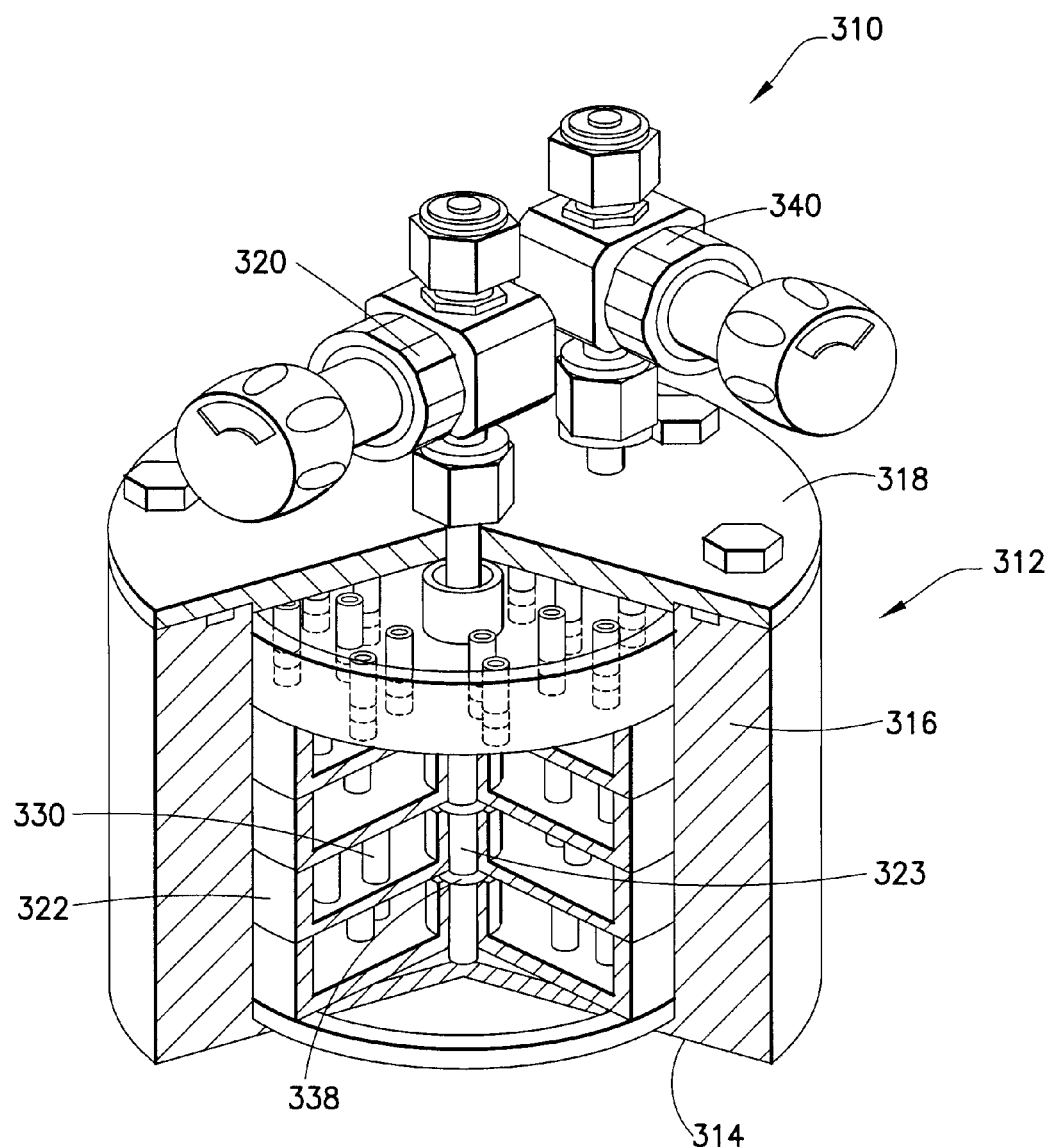
FIG. 3 is a schematic representation of a container useful in generating ruthenium tetraoxide, according to one specific embodiment of the invention.

FIG. 3 is a schematic representation of a container 310 useful in generating ruthenium tetraoxide, according to one specific embodiment of the invention. The container includes a vessel 312, fabricated of a suitable heat-conducting material, such as for example silver, silver alloys, copper, copper alloys, aluminum, aluminum alloys, lead, nickel clad, stainless steel, graphite and/or ceramic material. The vessel comprises a bottom 314 and sidewall 316 forming an internal compartment. The vessel can be any shape that facilitates an even flow of oxic gas through the vessel, such as the illustrated cylindrical shape. The preferred shape of the vessel base is a cylindrical shape machined to very tight tolerances. The container is fabricated to ensure that each side wall of the internal trays has good thermal contact with the interior walls of the vessel.

Oxic gas inlet 320 is preferably positioned on the vessel top 318 and communicatively connected to the vessel for introducing the oxic gas into the vessel. Positioned within the internal compartment of the vessel is a plurality of vertically stacked trays 322. The stacked trays are separable from each other and removable from the vessel for easy cleaning and refilling. Positioned within the vessel is an internal oxic gas member 323 that is connected (welded) to the gas inlet 320 and directs the oxic gas to the bottom of the internal compartment and below the lowest tray in the array of vertically stacked trays. The internal oxic gas member 323 passes through each tray cavity and tray bottom. If necessary to ensure a leak-proof seal at the point where the internal oxic gas member intersects the tray bottom, a sealing O-ring (not shown) may be positioned between trays. An addition of an outer o-ring is also contemplated to seal between trays on the top surface of each tray sidewall.

Depending on the specific form of the ruthenium tetraoxide precursor, it may be desirable to modify the container in order to prevent entrainment of solids in the gas flow through the container, by use of appropriate frit or filter elements in the gas flow path.

The ruthenium tetraoxide precursor material in the container may be coated in the form of a film on one or more of the support surfaces of the stacked trays in the FIG. 3. Such film may be applied by melting the ruthenium precursor, applying it over one or more of the support surfaces of the trays, followed by cooling to solidify the material in a layer on the surface of the trays. Alternatively, a solvent solution of the ruthenium tetraoxide precursor can be applied over one or more support surfaces of respective trays, followed by removal of the solvent to leave a deposit film of the ruthenium precursor on the surface of the trays.

One commercially available stacked tray container amenable for use for in situ generation of ruthenium tetraoxide in accordance with the present invention is the Pro-Evap™ vapor delivery vessel, available from ATMI, Inc. (Danbury, Conn., USA).

Figure 4:
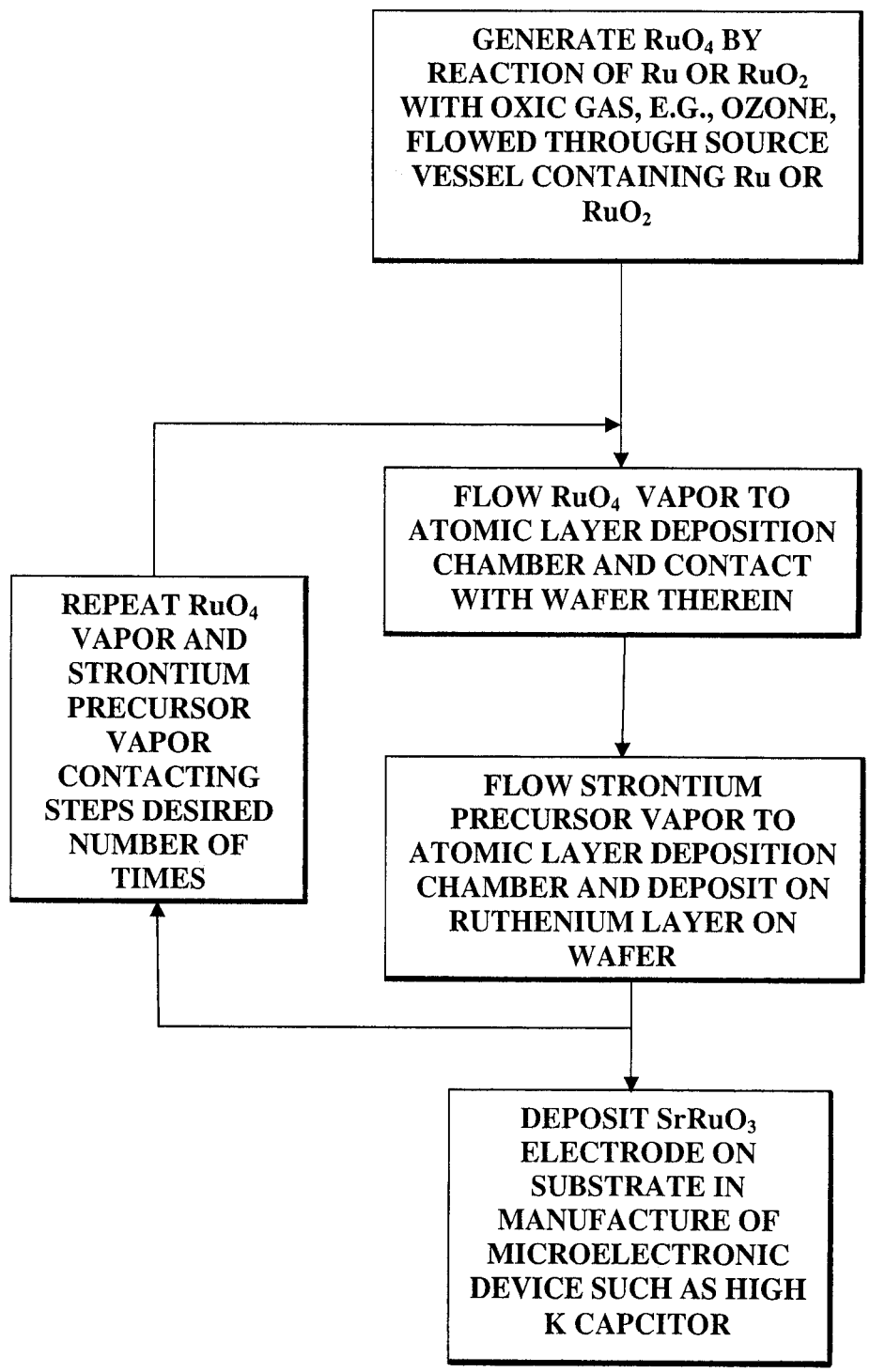
FIG. 4 is a schematic process diagram of a process for generating ruthenium tetraoxide, vapor depositing a strontium ruthenate electrode on a microelectronic device substrate, in the manufacture of a high k dielectric capacitor device, and abating ruthenate-containing effluent from the vapor depositing operation.

FIG. 4 is a schematic process diagram of a process for generating ruthenium tetraoxide, vapor depositing a strontium ruthenate electrode on a microelectronic device substrate for manufacture of a high k dielectric capacitor device, and abating ruthenium-containing effluent from the vapor depositing operation.

In the initial (top) step, ruthenium tetraoxide is generated by reaction of ruthenium or ruthenium dioxide with oxic gas, e.g., ozone, flowed through a source vessel containing ruthenium or ruthenium dioxide.

In the next step, the ruthenium tetraoxide vapor is flowed to an atomic layer deposition chamber and contacted with a wafer therein.

Thereafter, strontium precursor vapor is flowed to the atomic layer deposition chamber and deposited on the ruthenium layer on the wafer. The steps of ruthenium tetraoxide vapor and strontium precursor vapor contacting then are repeated a desired number of times in sequence, to deposit a strontium ruthenate electrode on the substrate in the manufacture of a microelectronic device such as a high dielectric constant capacitor.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A method of manufacturing a microelectronic device, comprising:
    providing at least one $RuO_4$ precursor selected from among Ru and $RuO_2$;
    contacting the $RuO_4$ precursor with an oxic gas at temperature in a range of from 40° C. to 400° C. to form gaseous $RuO_4$; and
    contacting the gaseous $RuO_4$ with a microelectronic device substrate under vapor deposition conditions to deposit Ru and/or $RuO_2$ thereon.

2. The method of claim 1, wherein the $RuO_4$ precursor comprises Ru, $RuO_2$ or Ru and $RuO_2$.

3. The method of claim 1, wherein the oxic gas is selected from the group consisting of oxygen, ozone, air, and nitrogen oxide.

4. The method of claim 1, wherein said contacting comprises chemical vapor deposition or atomic layer deposition.

5. The method of claim 4, wherein said contacting comprises atomic layer deposition, further comprising contacting the microelectronic device substrate with a strontium-containing precursor vapor, alternatingly and repetitively with said contacting of said microelectronic device substrate with said gaseous $RuO_4$, so as to form a strontium- and ruthenium-containing film on said microelectronic device substrate.

6. The method of claim 5, wherein said strontium-containing precursor vapor comprises vapor of a strontium precursor selected from the group consisting of $Sr(^nPrMe_4Cp)_2$, $Sr(EtMe_4Cp)_2$, $Sr(thd)_2$, and $Sr(thd)_2$.PMDETA.

7. The method of claim 5, wherein said strontium- and ruthenium-containing film comprises an $SrRuO_3$ film.

8. The method of claim 7, wherein said $SrRuO_3$ film forms an electrode of a capacitor on said microelectronic device substrate.

9. The method of claim 1, wherein said microelectronic device comprises a DRAM device.

* * * * *